(12) United States Patent
Yamaha

(10) Patent No.: US 6,555,465 B2
(45) Date of Patent: Apr. 29, 2003

(54) MULTI-LAYER WIRING STRUCTURE OF INTEGRATED CIRCUIT AND MANUFACTURE OF MULTI-LAYER WIRING

(75) Inventor: Takahisa Yamaha, Hamamatsu (JP)

(73) Assignee: Yamaha Corp. (JP)

( * ) Notice: Subject to any disclaimer, the term of this patent is extended or adjusted under 35 U.S.C. 154(b) by 0 days.

(21) Appl. No.: 10/175,994

(22) Filed: Jun. 19, 2002

(65) Prior Publication Data

US 2003/0003707 A1 Jan. 2, 2003

Related U.S. Application Data

(62) Division of application No. 09/206,507, filed on Dec. 7, 1998, now abandoned.

(30) Foreign Application Priority Data

Dec. 5, 1997 (JP) .............................................. 9-352434

(51) Int. Cl.[7] .............................................. H01L 21/28
(52) U.S. Cl. ........................ 438/624; 438/628; 438/637; 438/669; 438/685; 438/688; 438/785; 438/786
(58) Field of Search ................................. 438/624, 622, 438/628, 637, 669, 685, 688, 779, 785, 786, FOR 352, FOR 354, FOR 355

(56) References Cited

U.S. PATENT DOCUMENTS

| | | | | |
|---|---|---|---|---|
| 5,397,744 A | * | 3/1995 | Sumi et al. | |
| 5,459,093 A | * | 10/1995 | Kuroda et al. | |
| 5,534,461 A | * | 7/1996 | Kuwajima | |
| 5,623,166 A | * | 4/1997 | Olowalafe et al. | |
| 5,635,763 A | * | 6/1997 | Inoue et al. | |
| 5,705,429 A | * | 1/1998 | Yamaha et al. | |
| 5,741,721 A | * | 4/1998 | Stevens | |
| 5,750,403 A | * | 5/1998 | Inoue et al. | |
| 5,750,439 A | * | 5/1998 | Naito | |
| 5,792,673 A | * | 8/1998 | Nagura | |
| 5,843,848 A | * | 12/1998 | Yanagawa et al. | |
| 5,904,576 A | * | 5/1999 | Yamaha et al. | |
| 6,197,686 B1 | * | 3/2001 | Taguchi et al. | |

* cited by examiner

Primary Examiner—George Fourson
Assistant Examiner—Joannie Adelle Garcia
(74) Attorney, Agent, or Firm—Dickstein, Shapiro, Morin & Oshinsky, LLP

(57) ABSTRACT

A first wiring layer is formed on an insulating film. The first wiring layer is formed by sequentially laminating a barrier layer, an Al alloy layer, and an antireflection layer. The antireflection layer is formed by sequentially laminating a Ti layer, a TiN layer, and a TiON layer. After an interlayer insulating film is formed on the first wiring layer, a contact hole is formed through the interlayer insulating film and a tight adhesion layer is formed on an inner surface of the contact hole. The tight adhesion layer is formed by sequentially laminating a Ti layer, a TiN layer, a TiON layer, and a TiN layer. A W plug is embedded in the contact hole through CVD using $WF_6$. Thereafter, an Al alloy layer and an antireflection layer are sequentially deposited and patterned to form a second wiring layer. Pin holes are not formed in the uppermost TiON layer of the first wiring layer while the contact hole is formed through etching, and diffusion of $WF_6$ is intercepted by the TiON layer of the tight adhesion layer while W is deposited so that a high resistance $AlF_x$ layer is not formed in the second wiring layer. Resistance of an interlayer contact area of a multi-layer wiring structure can be prevented from being increased.

5 Claims, 13 Drawing Sheets

MULTI-LAYER WIRING STRUCTURE OF INTEGRATED CIRCUIT AND MANUFACTURE OF MULTI-LAYER WIRING

CROSS-REFERENCE TO RELATED APPLICATIONS

This is a divisional of U.S. patent application Ser. No. 09/206,507, filed Dec. 7, 1998 in the name of Takahisa YAMAHA now abandoned.

This application is based on Japanese patent application HEI 9-352434 filed on Dec. 5, 1997, the whole contents of which are incorporated herein by reference.

BACKGROUND OF THE INVENTION a) Field of the Invention

The present invention relates to a multi-layer wiring structure of integrated circuit suitable for LSI and the like and a method of forming a multi-layer wiring.

b) Description of the Related Art

Conventionally, a multi-layer wiring structure such as shown in FIG. 23 is known.

On the surface of a semiconductor substrate 1 made of silicon or the like, an insulating film 2 made of silicon oxide or the like is formed. A contact hole 2a is formed through the insulating film 2 in the area corresponding to a connection area 1a (e.g., impurity doped region) in the surface layer of the substrate. A first wiring layer 3 is formed on the insulating film and connected via the contact hole 2a to the connection area 1a of the substrate surface.

On the insulating film 2, an interlayer insulating film made of phosphosilicate glass (PSG) or the like is formed covering the wiring layer 3. A contact hole 4a is formed through the insulating film 4 in an area corresponding to a partial area of the wiring layer 3. On the insulating film 4, a second wiring layer 5 is formed, while being connected via the contact hole 4a to the wiring layer 3.

As an example of the wiring layer 3, a lamination structure is known (e.g., refer to U.S. Pat. No. 5,070,036). This lamination structure is made of, as shown in FIG. 24, a Ti layer 3a of 2 to 10 nm in thickness, a TiN or $TiO_xN_y$ (x=0.05 to 0.2, y=0.95 to 0.8) layer 3b of 50 to 200 nm in thickness, a Ti layer 3c of 7 to 20 nm in thickness, an Al alloy (Al—Si—Ti, or the like) layer 3d of 300 to 1000 nm in thickness, a Ti layer 3e of 7 to 20 nm in thickness, and a $TiO_xN_y$ (x=0.1 to 0.3, y=0.9 to 0.7) layer 3f of 50 to 500 nm in thickness, respectively stacked in this order from the bottom.

As another example of the wiring layer 3, a lamination structure is known (e.g., refer to JP-A-HEI-5-190551). This lamination structure is made of, as shown in FIG. 26, a TiN layer 3A, an Al alloy (or Al) layer 3B, a Ti layer 3C, and a TiN layer 3D, respectively stacked in this order from the bottom.

According to the conventional technique shown in FIG. 24, while the TiON layer 3f is formed on the Ti layer 3e through sputtering, the surface of the Ti layer 3e is oxidized and a $TiO_x$ film 3g having a high resistivity is formed as shown in FIG. 25. Since this layer having a high resistivity is interposed between the Ti layer 3e and TiON layer 3f, the resistance (via resistance) of the interlayer contact area between the wiring layers 3 and 5 increases by about 20%.

According to the conventional technique shown in FIG. 26, since the TiN layer 3D is formed on the Ti layer 3C, the surface of the Ti layer 3C is free from oxidation. However, according to the studies made by the inventor, it has been found that the resistance (via resistance) of the interlayer contact area increases if a plug embedded type wiring layer is formed as the wiring layer 5.

FIG. 27 shows an example of a conventional multi-layer wiring structure. Like elements to those shown in FIGS. 23 and 26 are represented by using identical reference numerals and the detailed description thereof is omitted. On an insulating film 2, a lamination structure is formed which is made of a Ti layer 3E of 10 to 20 nm in thickness, a TiN layer 3A of 100 nm in thickness, an Al alloy (Al—Si—Cu) layer 3B of 350 nm in thickness, a Ti layer 3C of 10 nm in thickness, and a TiN layer 3D of 50 nm in thickness, sequentially stacked in this order from the bottom. A lamination of the Ti layer 3E/TiN layer 3A under the Al alloy layer 3B constitutes a tight adhesion layer for the Al alloy layer 3B, and a lamination of the TiN layer 3D/Ti layer 3C functions as a protective layer for the Al alloy layer 3B. The lamination wiring structure is patterned in a desired wiring pattern to form a wiring layer 3.

On the insulating film 2, an insulating film 4 is formed covering the wiring layer 3. A contact hole 4a is formed through the insulating film 4 by selective dry etching. During this selective dry etching, pin holes P may be formed through the lamination of the Ti layer 3C /TiN layer 3D. Next, a tight adhesion layer 6 is formed covering the inner surface of the contact hole 4a and the upper surface of the insulating film 4. As the tight adhesion layer 6, a lamination of a Ti layer and a TiN layer stacked upon the Ti layer is used. The coverage of the tight adhesion layer 6 lowers at the areas where the pin holes P are formed.

Next, a W layer is formed over the substrate through blanket chemical vapor deposition (CVD). Thereafter, the W layer is etched back to leave a plug 7 made of W in the contact hole 4a. Blanket CVD generally uses $WF_6$ as a source gas. Therefore, $WF_6$ reaches the Al alloy layer 3B via the coverage lowered areas of the pin holes P and forms a high resistance aluminum fluoride ($AlF_x$) layer 8 by the following chemical formula.

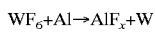

Thereafter, a wiring material layer made of Al alloy or the like is formed over the substrate. By pattering the lamination of the wiring material layer and tight adhesion layer 6, a second wiring layer connected to the plug 7 is formed. Since the high resistance $AlF_x$ layer 8 exists at the interlayer contact area between the second wiring layer and the wiring layer 3, the via resistance increases. An increase of the via resistance changes with the conditions of the generated $AlF_x$ layer 8, and the via resistance distributes in a range from a two- to threefold to a tenfold of a standard via resistance or further larger.

SUMMARY OF THE INVENTION

It is an object of the present invention to provide a novel multi-layer wiring structure or wiring layer forming method capable of suppressing a resistance increase in the interlayer contact area.

According to one aspect of the present invention, a multilayer wiring forming method comprises the steps of:

forming an Al or Al alloy layer on a first insulating film covering a substrate;

forming a first Ti layer on the Al or Al alloy layer;

sequentially laminating a first TiN layer and a first TiON layer in this order on the first Ti layer through reactive sputtering;

patterning a lamination of the Al or Al alloy layer, the first Ti layer, the first TiN layer, and the first TiON layer into a desired wiring pattern to form a first wiring layer;

forming a second insulating film on the first insulating film, the second insulating film covering the first wiring layer;

forming a contact hole through the second insulating film, the contact hole reaching a partial surface area of the first TiON layer;

forming a tight adhesion layer covering an inner surface of the contact hole;

forming a conductive plug embedding an inside of the contact hole, with the tight adhesion layer being interposed under the conductive plug; and forming a second wiring layer on the second insulating film, the second wiring layer being connected to the plug.

With the resulting structure, the first wiring layer is a lamination of the Al or Al alloy layer, first Ti layer, first TiN layer, and first TiON layer. The Al or Al alloy layer is a main wiring layer of the first wiring layer. The first Ti layer prevents the surface of the Al or Al alloy layer from being nitrided while the first TiN layer is formed. The first TiN layer prevents the surface of the first Ti layer from being oxidized while the first TiON layer is formed. The first TiON layer functions as an antireflection layer during a photolithography process for patterning the first wiring layer and also prevents generation of pin holes during a dry etching process for forming the contact hole in the second insulating film.

A nitride film is therefore hard to be formed on the surface of the Al or Al alloy layer, and an oxide film is also hard to be formed on the surface of the first Ti layer. Since pin holes are not formed in the first TiON layer during the dry etching process for forming the contact hole, the coverage of the tight adhesion layer does not lower, and an $AlF_x$ layer is suppressed from being formed through reaction between $WF_6$ and Al while the plug is formed. Accordingly, a via resistance in the interlayer contact area between the first and second wiring layers can be prevented from being increased.

In this multi-layer wiring structure, a tight adhesion layer for the higher level wiring layer may be a lamination of a second Ti layer, a second TiN layer, a second TiON layer, and a third TiN layer stacked one on top of the other in the order stated. In this case, the second Ti layer functions as a layer which lowers resistance. The second TiN layer prevents the surface of the second Ti layer from being oxidized while the second TiON layer is formed. The second TiON layer functions as a barrier layer for preventing permeation of $WF_6$ while a plug is formed. The third TiN layer improves tight adhesion to the W layer and prevents diffusion of oxygen from the second TiON layer to the W layer.

Since permeation of $WF_6$ is intercepted by the second TiON layer, reaction between $WF_6$ and Al does not occur so that a resistance rise in the interlayer contact area can be suppressed. Since the third TiN layer intercepts diffusion of oxygen from the second TiON layer to the W layer, it is possible to prevent an etching rate of the W layer from being locally raised, so that the W layer can be etched back uniformly.

Stable and good electrical connection is achieved by sequentially laminating Ti/TiN/TiON/TiN (lower layer/upper layer) and using this lamination as a tight adhesion layer between an Si substrate and a wiring layer to be connected via a contact hole.

Also with respect to electrical connection in a multi-layer wiring structure between a lower level Al wiring layer and a higher level Al wiring layer via a via hole, a resistance increase in an interlayer contact area can be suppressed by using a lamination of Ti/TiN/TiON/TiN as a tight adhesion layer. The via resistance increase can be suppressed more if such a tight adhesion layer is used in combination with a Ti/TiN/TiON/TiN antireflection film.

As above, in the multi-layer wiring structure/for integrated circuits, the uppermost layer of a lower level wiring layer is made of TiON so that pin holes are not formed during a dry etching process for forming a contact hole through an interlayer insulating film. Accordingly, an $AlF_x$ layer is not formed in the lower level wiring layer while the plug is formed in the contact hole, and a resistance increase in the interlayer contact area can be suppressed.

A lamination of Ti/TiN/TiON/TiN sequentially stacked is used as the tight adhesion layer. Since the TiON layer intercepts permeation of $WF_6$, reaction between $WF_6$ and Al does not occur. Therefore, a resistance increase in the interlayer contact area can be suppressed. Since the TiN layer covering the TiON layer prevents oxygen diffusion from the TiON layer to the W layer, the W layer can be etched back uniformly.

In a multi-layer wiring structure, in forming an antireflection layer on an Al or Al alloy layer, after the Ti layer is formed, the TiN layer and TiON layer are formed in succession through reactive sputtering. Also, in forming a tight adhesion layer, after the Ti layer is formed, the TiN layer, TiON layer, and TiN layer are formed in succession through reactive sputtering. This successive film forming improves a throughput.

DETAILED DESCRIPTION OF THE PREFERRED EMBODIMENTS

FIGS. 1 to 11 are cross sectional views of a substrate illustrating main steps of a method of forming a multi-layer wiring according to an embodiment of the invention. Processes (1) to (11) corresponding to FIGS. 1 to 11 will be sequentially described.

Figure 27:
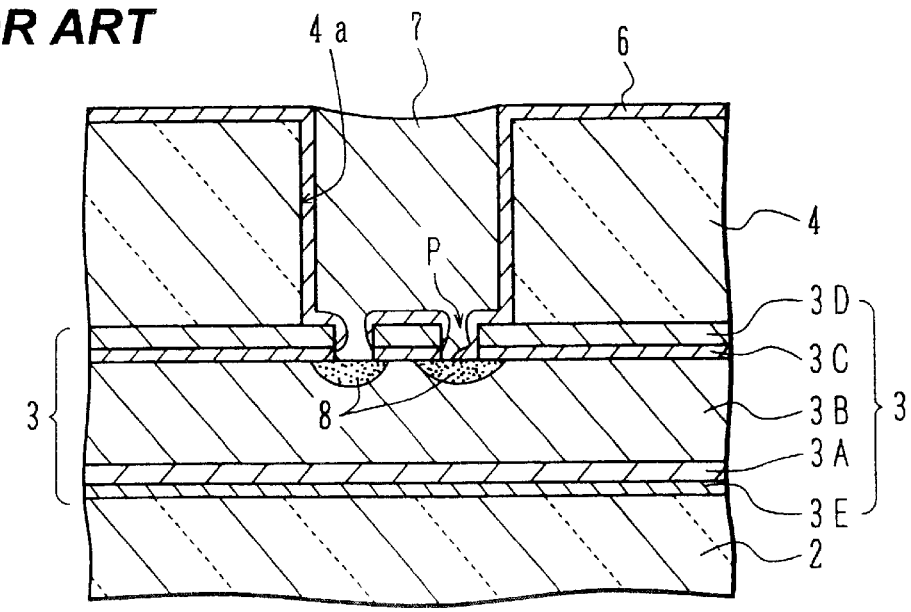
FIG. 27 is a cross sectional view of a conventional multi-layer wiring structure.

(1) On the surface of a semiconductor substrate 10 made of, for example, silicon, an insulating film 12 having a thickness of about 0.8 μm is formed by CVD or the like. The insulating film 12 may be a lamination of a PSG film and a borophosphosilicate glass (BPSG) film stacked upon the PSG film. On the insulating film 12, an Al alloy layer 16 is formed with a barrier layer 14 being interposed therebetween. The barrier layer 14 may be a lamination of a Ti layer and a TiN layer stacked upon the Ti layer, such as shown in FIG. 27.

A contact hole reaching the substrate surface may be formed through the insulating film 12 by similar processes to be described later with reference to FIGS. 5 to 8, and the contact hole is buried with a plug made of W or the like by interposing a tight adhesive layer therebetween. In this case, the barrier layer 14 may be a tight adhesion layer made of a lamination of Ti, TiN, TiON, and TiN sequentially deposited in this order from the bottom, or a lamination of this tight adhesion layer and a Ti layer deposited on the tight adhesion layer.

As the Al alloy layer 16, an Al—Si—Cu alloy layer of 400 nm in thickness was formed in a first sputtering chamber. The film forming conditions were:

Ar flow rate: 18 sccm

Gas pressure: 2 mTorr

Substrate Temperature: 150° C.

Figure 12:
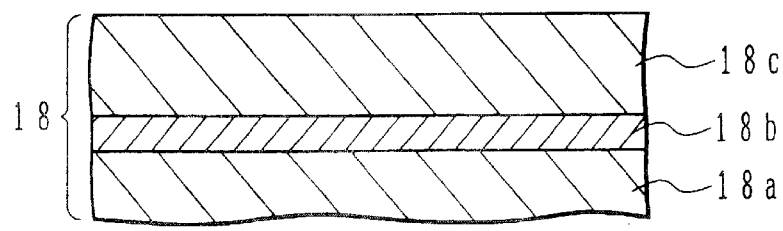
FIG. 12 is a cross sectional view showing a lamination structure of the antireflection layer.

Film forming speed: 1000 nm/min (2) On the Al alloy layer 16, an antireflection layer 18 is formed. As shown in FIG. 12, the antireflection layer 18 was a lamination of a Ti layer 18a of 20 nm in thickness, a TiN layer 18b of 10 nm in thickness, and a TiON layer 18c of 30 nm in thickness, sequentially stacked in this order from the bottom. The Ti layer 18a was formed in a second sputtering chamber. The film forming conditions were:

Ar flow rate: 15 sccm

Gas pressure: 4 mTorr

Substrate Temperature: 150° C.

Film forming speed: 100 nm/min

The TiN layer 18b and TiON layer 18c were sequentially formed in a third sputtering chamber through reactive sputtering. Specifically, in the third sputtering chamber, the TiN layer 18b was formed under the conditions A shown in Table 1 and thereafter, without exposing the substrate in the atmospheric (external) air, the TiON layer 18c was formed by changing the film forming conditions to the conditions B shown in Table 1.

TABLE 1

|  | Conditions A | Conditions B |
| --- | --- | --- |
| Ar flow rate | 40 sccm | 30 sccm |
| N₂ flow rate | 85 sccm | 85 sccm |
| O₂ flow rate | 0 sccm | 10 sccm |
| Gas pressure | 4 mTorr | 4 mTorr |
| Substrate temperature | 150° C. | 150° C. |
| Film forming speed | 75 nm/min | 75 nm/min |

As an alternative film forming method, the Ti layer 18a, TiN layer 18b, and TiON layer 18c may be formed in succession in the third sputtering chamber.

Since the TiN layer 18b is formed after the Ti layer 18a is formed on the Al alloy layer 16, the Ti layer 18a prevents the surface of the Al alloy layer 16 from being nitrided while the TiN layer 18b is formed. Further, since the TiON layer 18c is formed after the TiN layer 18b is formed, the TiN layer 18b prevents the surface of the Ti layer 18a from being oxidized while the TiON layer 18c is formed. If the TiN layer 18b and TiON layer 18c are formed in succession through reactive sputtering, a throughput can be improved.

(3) A lamination of the barrier layer 14, Al alloy layer 16, and antireflection layer 18 is patterned in a desired pattern by known photolithography and dry etching to thereby form a wiring layer 20. The wiring layer 20 is made of a lamiation of a left portion 14A of the barrier layer 14, a left portion 16A of the Al alloy layer 16, and a left portion 18A of the antireflection layer 18. When a resist pattern as an etching mask is formed through photolithography, the antireflection layer 18 suppresses light reflection from the Al alloy layer 16 so that the resist pattern can be formed at a high precision and a high precision patterning becomes possible during the dry etching process. For example, the dry etching process was performed by using Cl₂/BCl₃ gas at a pressure of 10 mTorr. After the dry etching process, the resist pattern is removed by known ashing or the like.

(4) An interlayer insulating film 22 is formed on the insulating film 12, covering the wiring layer 20. The insulating film 22 was formed by the following method. After a silicon oxide film having a thickness of 150 nm is formed over the substrate through plasma CVD, a hydrogen silsesquioxane resin film of 400 nm in thickness is formed on the silicon oxide film through spin coating. The resin film is subjected to a thermal treatment for transformation to pre-ceramic or ceramic to form a ceramic silicon oxide film. On this ceramic silicon oxide film, a silicon oxide film of 300 nm in thickness is formed through plasma CVD.

(5) A contact hole 22a is formed through the insulating film 22 in an area corresponding to a partial area of the wiring layer 20 (a partial area of the uppermost TiON layer 18c of the wiring layer 20), through known photolithography and dry etching. For example, the dry etching conditions were:

Gas flow rate: $CHF_3/CF_4/Ar=30/5/100$ sccm

Pressure: 200 mTorr

Power: 700 W

The contact hole 22a having a diameter of 0.5 μm was formed. During the dry etching process of forming such a contact hole, pin hole was not formed in the uppermost TiON layer 18c of the wiring layer 20. Comparison experiments of forming pin holes in the TiN layer and TiON layer were conducted, which will be later described.

(6) After Ar sputtering is performed in order to clean the bottom of the contact hole 22a (surface of the TiON layer 18c), a tight adhesion layer 24 is formed covering the inner surface of the contact hole 22a and the upper surface of the insulating film 22. For example, the sputtering conditions were:

Ar pressure: 2.5 mTorr

RF power: 500 W

Time: 60 seconds

Figure 13:
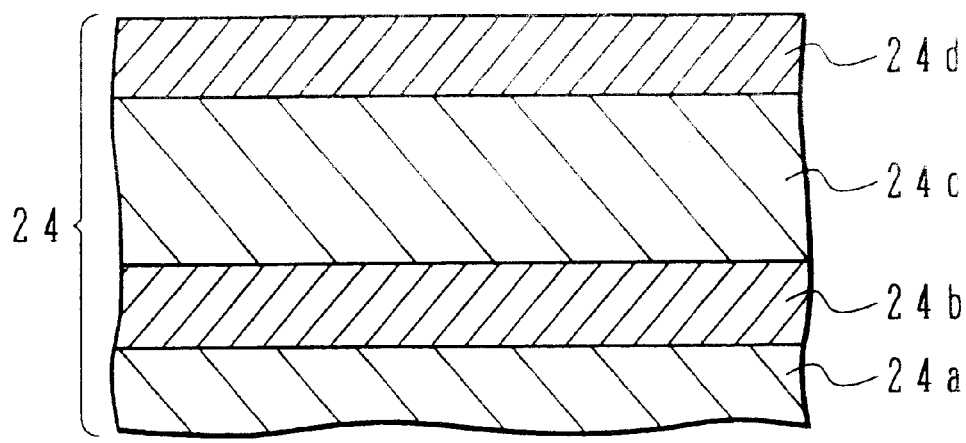
FIG. 13 is a cross sectional view showing a lamination structure of the tight adhesion layer.

The tight adhesion layer 24 was made of a lamination of, as shown in FIG. 13, a Ti layer 24a of 20 nm in thickness, a TiN layer 24b of 25 nm in thickness, a TiON layer 24c of 50 nm in thickness, and a TiN layer 24d of 25 nm in thickness, sequentially deposited in this order from the bottom. The Ti layer 24a was formed in the second sputtering chamber. The film forming conditions were:

Ar flow rate: 15 sccm

Gas pressure: 4 mTorr

Substrate temperature: 150° C.

Film forming speed: 100 nm/min

The TiN layer 24b, TiON layer $^{24}c$, and TiN layer 24d were sequentially formed in the third sputtering chamber through reactive sputtering. Specifically, in the third sputtering chamber, the TiN layer 24b was formed under the conditions A shown in Table 2 and thereafter, without exposing the substrate in the atmospheric air, the TiON layer 24c was formed by changing the film forming conditions to the conditions B shown in Table 2, and thereafter, without exposing the substrate in the atmospheric air, the TiN layer 24d was formed by changing the film forming conditions to the conditions C shown in Table 2.

TABLE 2

| | Conditions A | Conditions B | Conditions C |
|---|---|---|---|
| Ar flow rate | 40 sccm | 30 sccm | 40 sccm |
| $N_2$ flow rate | 85 sccm | 85 sccm | 85 sccm |
| $O_2$ flow rate | 0 sccm | 10 sccm | 0 sccm |
| Gas pressure | 4 mTorr | 4 mTorr | 4 mTorr |
| Substrate temperature | 150° C. | 150° C. | 150° C. |
| Film forming speed | 75 nm/min | 75 nm/min | 75 nm/min |

As an alternative film forming method, the Ti layer 24a, TiN layer 24b, TiON layer 24c, and TiN layer 24d may be formed in succession in the third sputtering chamber.

Since the Ti layer 24a is formed as the lowermost layer of the tight adhesion layer 24, a low resistance contact to the wiring layer 20 is possible. Further, since the TiON layer 24c is formed after the TiN layer 24b is formed, the TiN layer 24b prevents the surface of the Ti layer 24a from being oxidized while the TiON layer 24c is formed.

Figure 7:
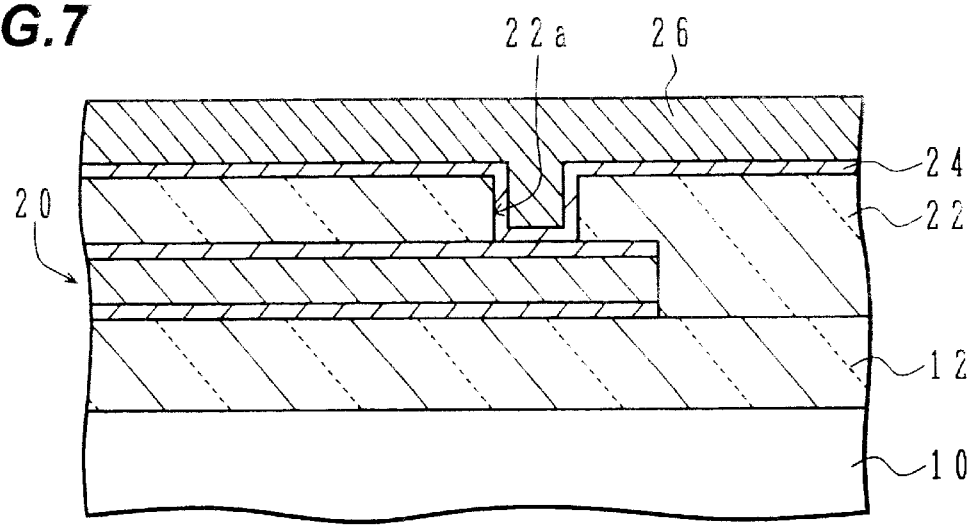
FIG. 7 is a cross sectional view of the substrate illustrating a step of forming a W layer after the process shown in FIG. 6.
Figure 8:
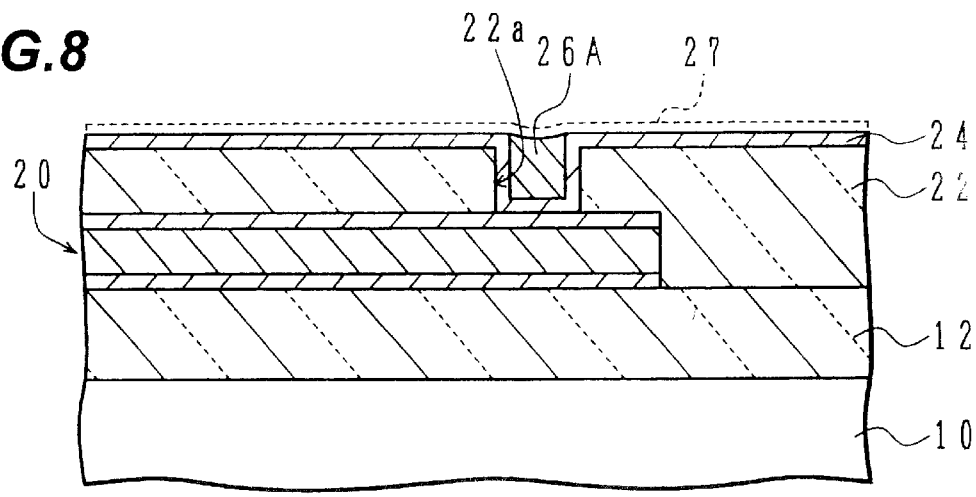
FIG. 8 is a cross sectional view of the substrate illustrating an etch-back process after the process shown in FIG. 7.
Figure 9:
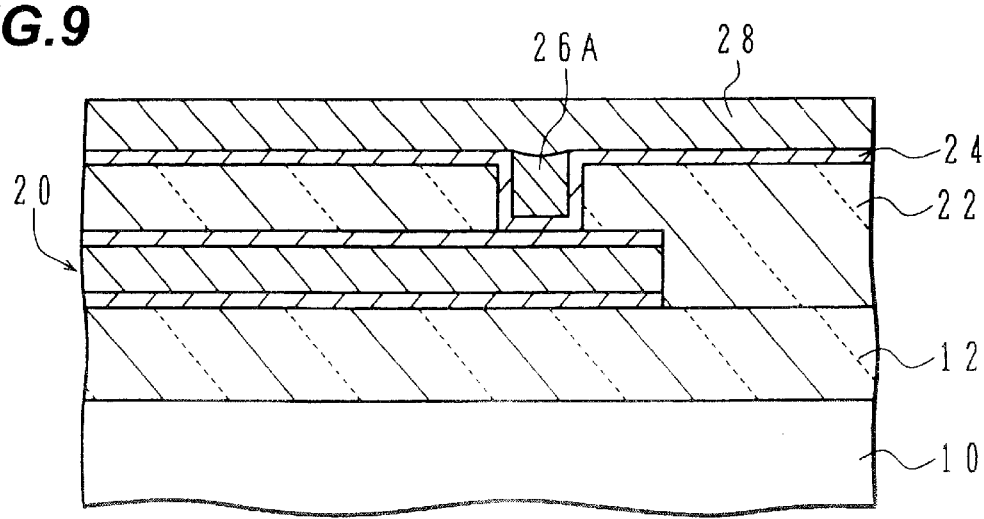
FIG. 9 is a cross sectional view of the substrate illustrating a step of forming an Al alloy layer after the process shown in FIG. 8.
Figure 10:
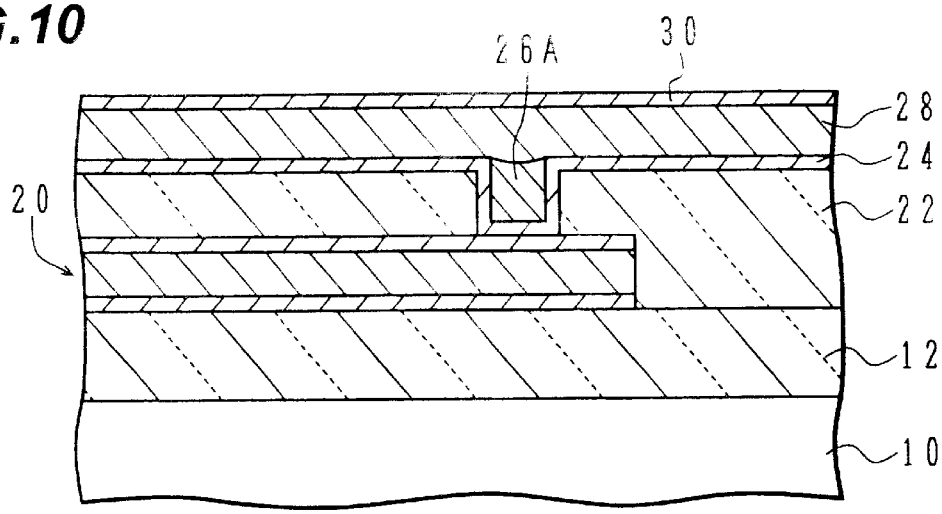
FIG. 10 is a cross sectional view of the substrate illustrating a step of forming an antireflection layer after the process shown in FIG. 9.
Figure 11:
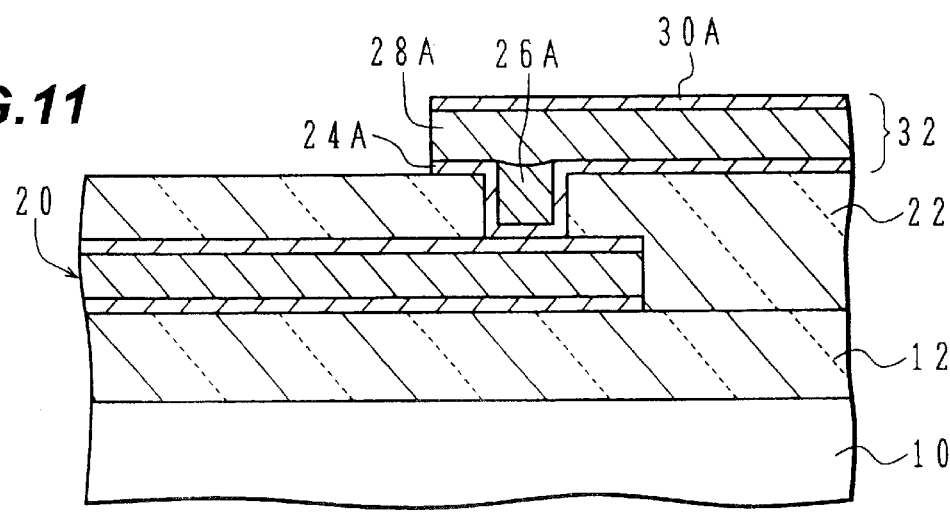
FIG. 11 is a cross sectional view of the substrate illustrating a step of patterning a wiring layer after the process shown in FIG. 10.

The TiON layer 24c is provided in order to prevent $WF_6$ from permeating during a W deposition process shown in FIG. 7. A permeation state of W and F into the TiN layer and TiON layer was inspected, which will be later described. Since the TiN layer 24d is formed after the TiON layer 24c is formed, the TiN layer 24d can prevent oxygen in the TiON layer 24c from being diffused into the W layer. If oxygen in the TiON layer 24c diffuses into the W layer, an etching rate of the W layer locally increases so that a uniform etch-back of the W layer during an etch-back process shown in FIG. 8 becomes difficult. Since the TiON layer 24c is covered with the TiN layer 24d, a uniform etch-back of the W layer becomes possible. If the TiN layer 24b, TiON layer 24c, and TiN layer 24d are formed in succession by reactive sputtering, a throughput can be improved.

(7) A W layer 26 is formed over the substrate surface to fill the contact hole 22a with the W layer, with the tight adhesion layer 24 being interposed under the W layer 26. For example, nuclei were grown under the following conditions:

Gas flow rate: $WF_6/SiH_4=7–20/4$ sccm

Pressure: 4 Torr

Substrate temperature: 430° C.

Time: 35 seconds, and then, the W layer 26 was formed to a thickness of 550 nm under the following conditions:

Gas flow rate: $WF_6/H_2=80/720$ sccm

Pressure: 50 to 80 Torr

Substrate temperature: 450° C.

Film forming speed: 0.3 to 0.5 μm/min.

(8) The W layer 26 is etched back to expose the tight adhesion layer 24 and leave a portion of the W layer 26 as a plug 26A which is filled in the inside of the contact hole 22a, with the tight adhesion layer 24 being interposed under the plug. For example, this etch-back was performed by using a microwave plasma etcher in presence of a magnetic field. The etching conditions were:

Gas flow rate: $SF_6=140$ sccm

Pressure: 270 Pa

RF bias power: 200 W

Substrate temperature: 30° C.

Time: 140 seconds.

After the etch-back, a wiring underlying layer 27 made of Ti or the like may be formed, if desired, covering the plug 26A and left tight adhesion layer 24. Alternatively, in succession to the etch-back of the W layer 26, the tight adhesion layer 24 may be etched back until the insulating film 22 is exposed and thereafter a wiring underlying layer such as a lamination of TiN (or TiON)/Ti (Ti is a lower layer) may be formed covering the plug 26A and left insulating film 22.

(9) An Al alloy layer 28 is formed covering the plug 26A and tight adhesion layer 24. As the Al alloy layer 28, an Al—Si—Cu alloy layer was formed by the process similar to that described with reference to FIG. 1.

(10) An antireflection layer 30 is formed covering the Al alloy layer 28. As the antireflection layer 30, a lamination of TiON/TiN/Ti (Ti is the lowermost layer) by the processes similar to those described with reference to FIGS. 2 and 12.

(11) The lamination of the tight adhesion layer 24, Al alloy layer 28, and antireflection layer 30 is patterned in a desired wiring pattern through photolithography and dry etching to form a wiring layer 32. The wiring layer 32 is made of a lamination of a left portion 24A of the tight adhesion layer 24, a left portion 28A of the Al alloy layer 28, and a left portion 30A of the antireflection layer 30. When a resist pattern as an etching mask is formed through photolithography, the antireflection layer 30 suppresses light reflection from the Al alloy layer 28 so that the resist pattern can be formed at a high precision and a high precision patterning becomes possible during the dry etching process. The dry etching process was performed in a manner similar to the process described with reference to FIG. 3. After the dry etching process, the resist pattern is removed by known ashing or the like.

Thereafter, if necessary, the processes of FIGS. 4 to 11 are repeated to form a higher level wiring layer connected to the wiring layer 32.

Figure 14:
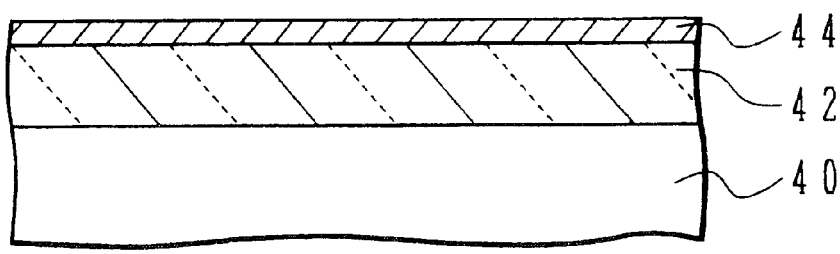
FIG. 14 is a cross sectional view of a substrate illustrating a dry etching process for a TiN layer and a TiON layer used by a method of forming samples for pin hole inspection.
Figure 15:
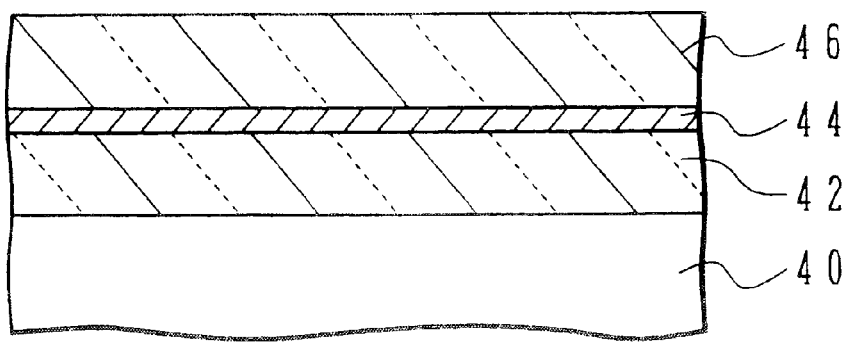
FIG. 15 is a cross sectional view of a substrate illustrating a step of forming a silicon oxide film after the process shown in FIG. 14.

Comparison experiments of forming pin holes in TiN and TiON layers through dry etching were conducted. FIGS. 14 and 15 are cross sectional views illustrating a method of forming samples for pin hole inspection.

In the process shown in FIG. 14, on the surface of a semiconductor substrate 40 made of silicon, a field insulating film 42 of silicon oxide was formed to a thickness of 500 nm through thermal oxidation. On the insulating film 42, a film 44 of TiN or TiON was formed to a thickness of 50 nm through reactive sputtering same as the process of FIG. 2. Thereafter, the whole surface of the TiN or TiON film 44 was dry-etched under the conditions same as those of the contact hole forming process shown in FIG. 5.

Next, in the process shown in FIG. 15, a silicon oxide film 46 was formed on the Ti or TiON film 44 to a thickness of 50 nm through CVD. The surface of the silicon oxide film 46 was observed with a scanning electron microscope (SEM).

Two types of samples were prepared. A sample group P includes samples $P_1$ to $P_4$ whose film 44 is made of TiN. A sample group Q includes samples $Q_1$ to $Q_4$ whose film 44 is made of TiON. The dry etching in the process shown in FIG. 14 was not performed for both the samples $P_1$ and $Q_1$. The dry etching in the process shown in FIG. 14 was performed for 60 seconds for the samples $P_2$ and $Q_2$. The dry etching in the process shown in FIG. 14 was performed for 120 seconds for the samples $P_3$ and $Q_3$. The dry etching in the process shown in FIG. 14 was performed for 180 seconds for the samples $P_4$ and $Q_4$.

Figure 16A:
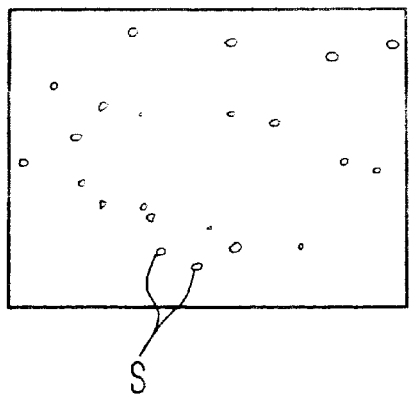
FIGS. 16A and 16B are sketches of SEM photographs showing pin hole inspection results.
Figure 16B:
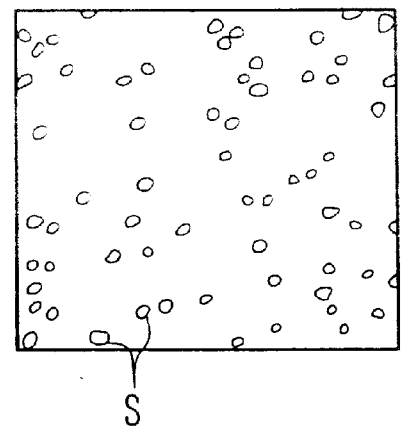

FIGS. 16A and 16B are sketches of SEM photographs and show the inspection results of pin holes S of the samples $P_3$ and $P_4$. It can be understood by the comparison between FIGS. 16A and 16B that of the samples $P_3$ and $P_4$ whose film 44 is made of TiN, the sample $P_4$ having a longer dry etching time has larger sizes of pin holes S. Pin holes were not observed in the samples $P_1$, $P_2$, and $Q_1$ to $Q_4$ other than the samples $P_3$ and $P_4$.

It can be understood from the experiment results that pin holes are more difficult to be formed in the TiON layer than in the TiN layer. Therefore, by forming the TiON layer 18c as the uppermost layer of the antireflection layer 18 in the process of FIG. 2, pin holes can be prevented from being formed during the dry etching process of FIG. 5 and the coverage of the tight adhesion layer can be prevented from being lowered in the tight adhesion film forming process of FIG. 7.

Figure 17:
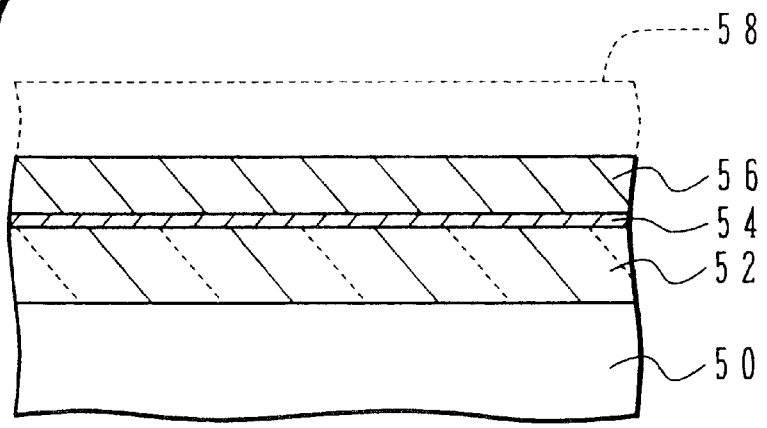
FIG. 17 is a cross sectional view of a substrate as a first sample used for SIMS analysis.
Figure 18:
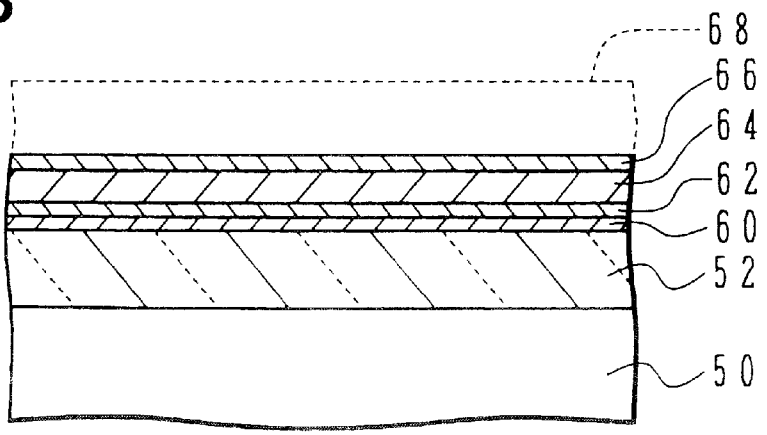
FIG. 18 is a cross sectional view of a substrate as a second sample used for SIMS analysis.

A permeation state of W and F into the TiN and TiON layers was inspected by secondary ion mass spectrometry (SIMS) analysis. FIGS. 17 and 18 are cross sectional views of first and second samples used for the SIMS analysis.

The sample shown in FIG. 17 is formed in the following method. On the surface of a semiconductor substrate 50 of silicon, a field insulating film 52 of silicon oxide is formed through thermal oxidation. On this insulating film 52, a Ti layer 54 of 15 nm in thickness and a TiN layer 56 of 100 nm in thickness are sequentially laminated. On the TiN layer 56, a W layer 58 of 550 nm in thickness is formed and the W layer 58 is completely etched back.

The sample shown in FIG. 18 is formed in the following method. The semiconductor substrate 50 and insulating film 52 are the same as those of the sample shown in FIG. 17. On the insulating film 52, a 15 nm thick Ti layer 60, a 25 nm thick TiN layer 62, a 50 nm thick TiON layer 64, and a 25 nm thick TiN layer 166 are sequentially laminated. On the TiN layer 66, a W layer 68 is formed to a thickness of 550 nm and the W layer 68 is completely etched back.

In the methods of forming the samples shown in FIGS. 17 and 18, the Ti layer was formed through sputtering, and the TiN and TiON layers were formed through reactive sputtering. The film forming conditions were the same as those used in the process of FIG. 6. The film forming and etch-back conditions for the W layer were the same as those used in the process of FIGS. 7 and 8. Each of the samples shown in FIGS. 17 and 18 was analyzed in the depth direction through SIMS analysis. The analysis results are shown in FIGS. 19 to 22.

Figure 19:
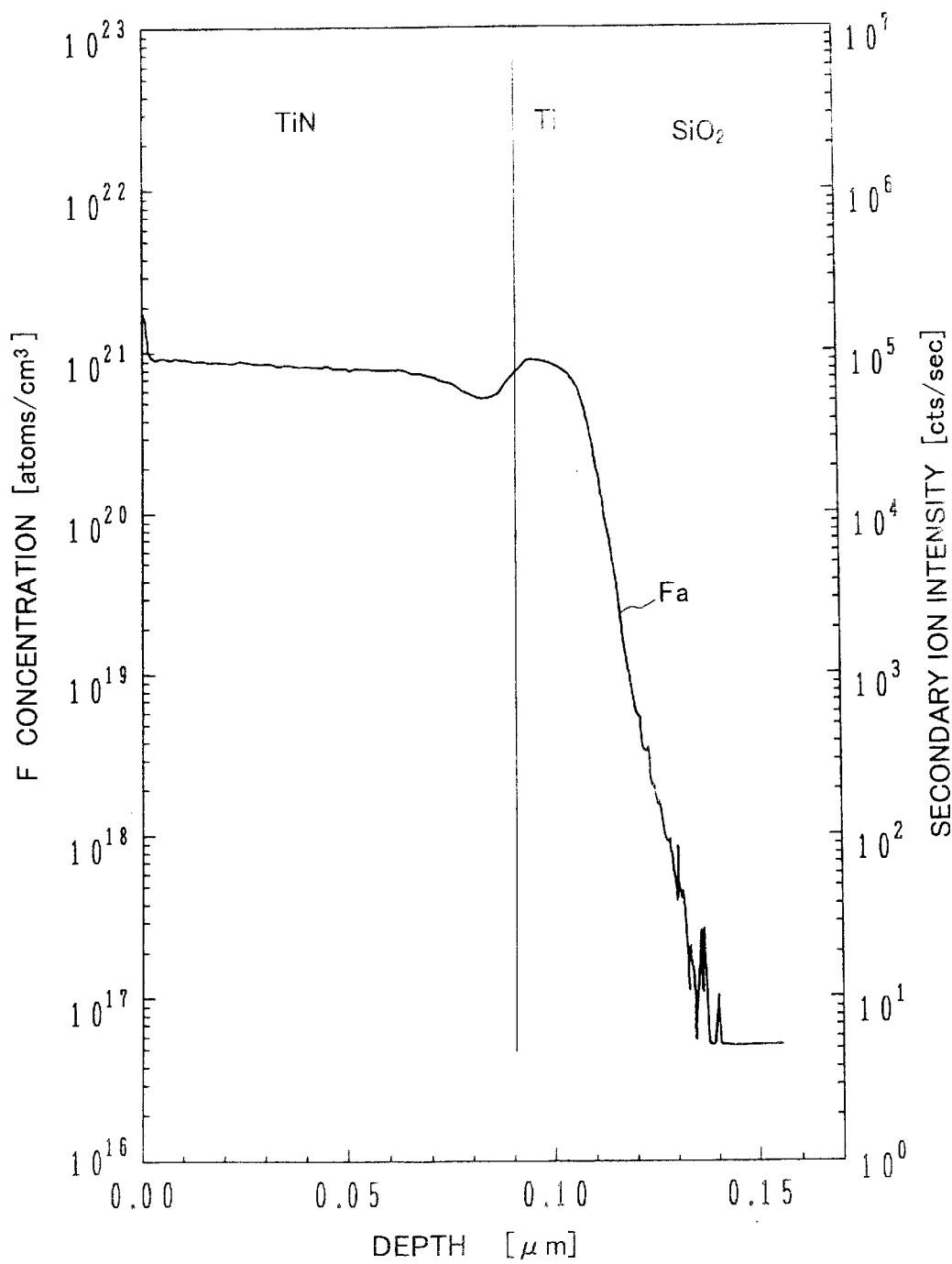
FIG. 19 is a graph showing a fluorine concentration distribution in the first sample.
Figure 20:
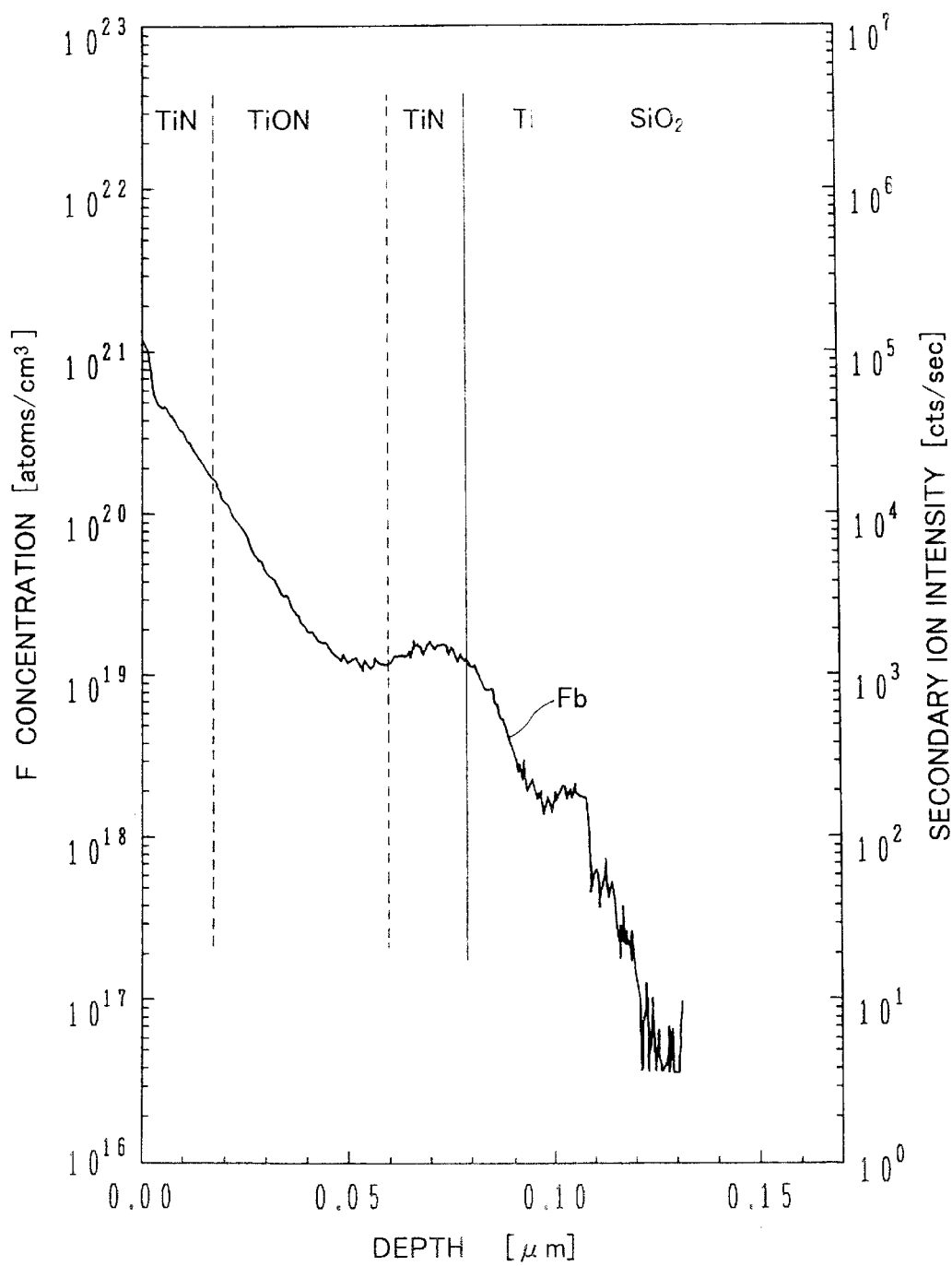
FIG. 20 is a graph showing a fluorine concentration distribution in the second sample.

FIGS. 19 and 20 are graphs showing fluorine concentration distributions of the samples shown in FIGS. 17 and 18 by curves Fa and Fb. It can be understood from the comparison between FIGS. 19 and 20 that although F passes through the TiN layer, its diffusion is suppressed in the TiON layer. It can therefore be said that the TiON layer has a barrier capability relative to F.

Figure 21:
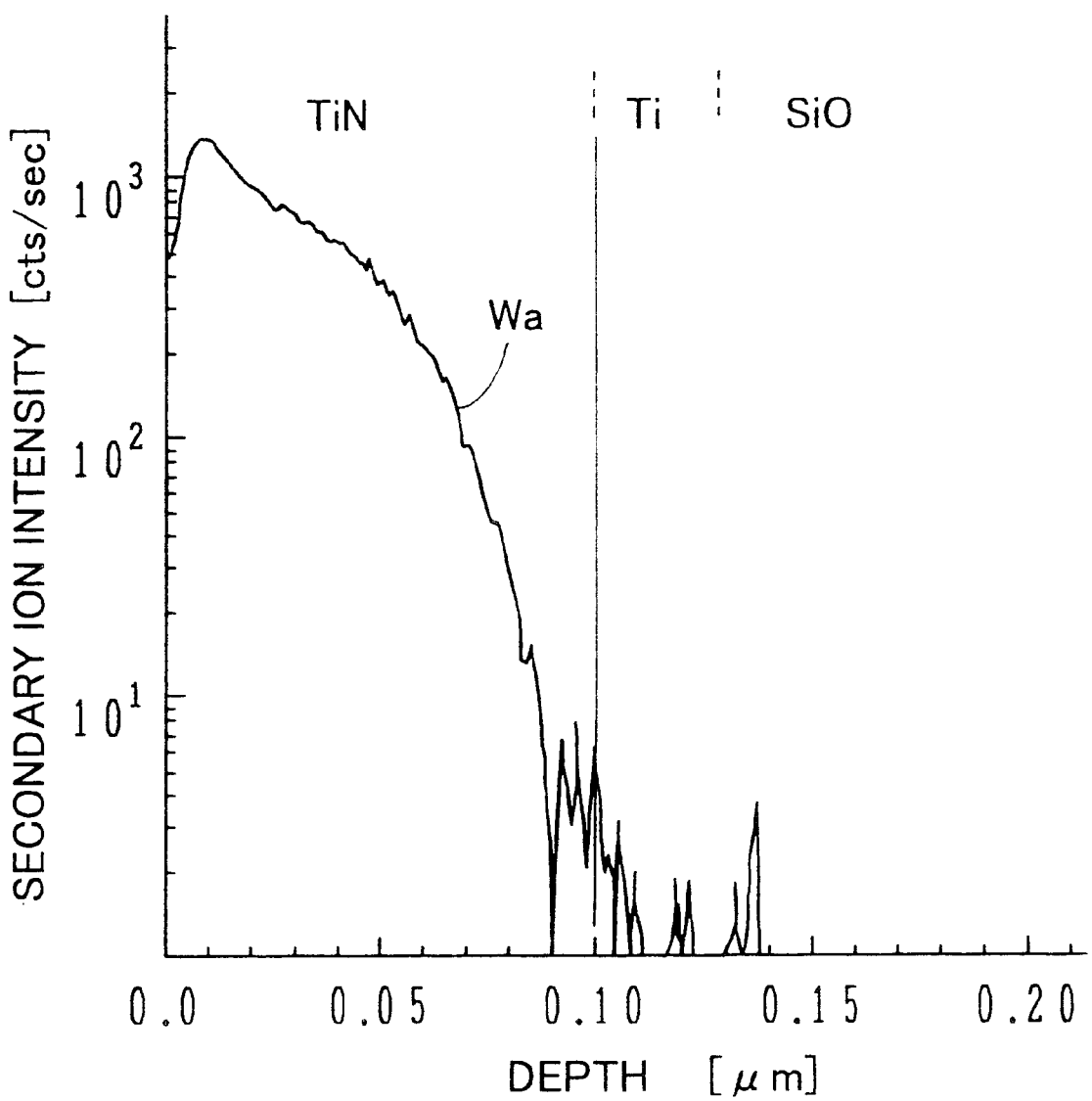
FIG. 21 is a graph showing a tungsten permeation state in the first sample.
Figure 22:
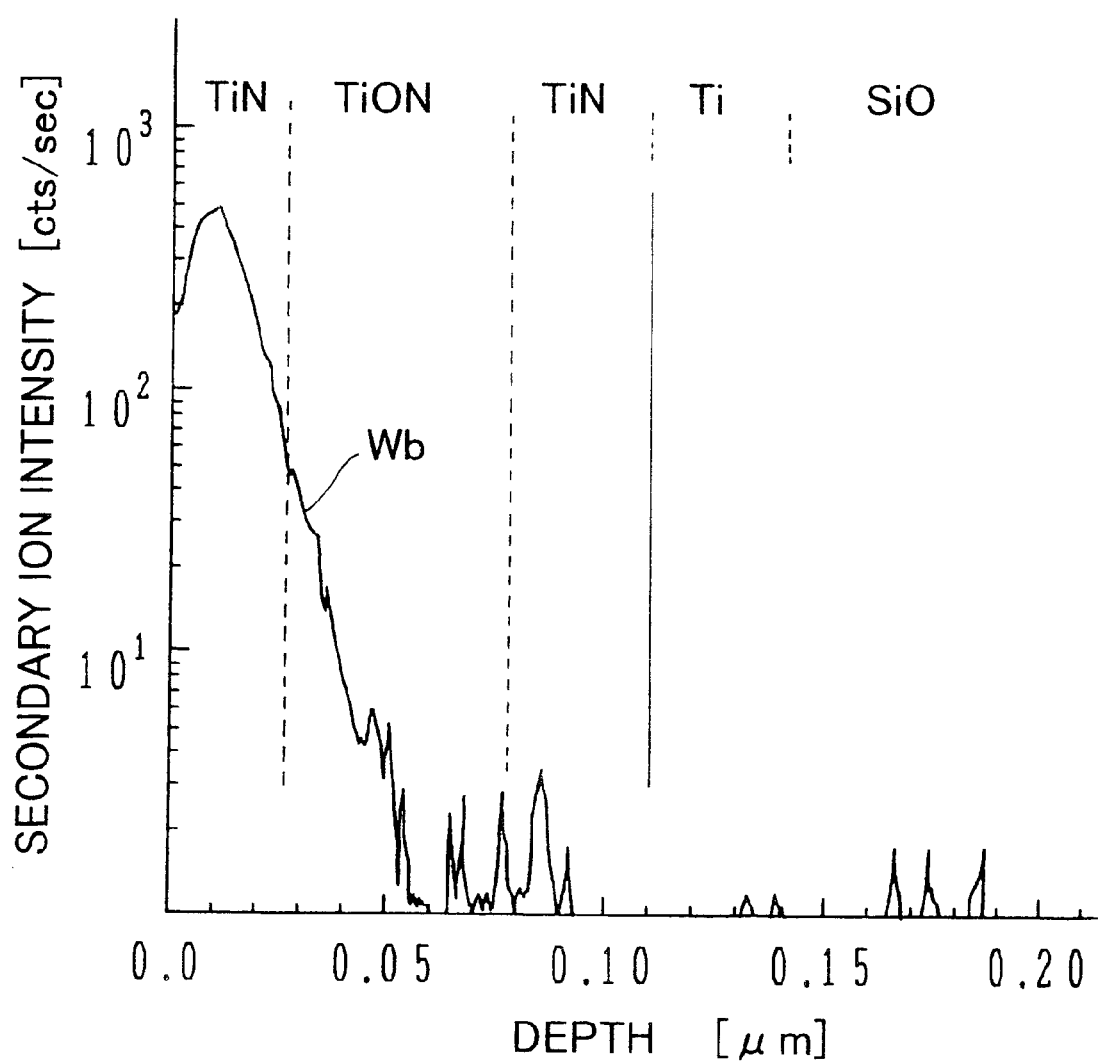
FIG. 22 is a graph showing a tungsten permeation state in the second sample.
Figure 23:
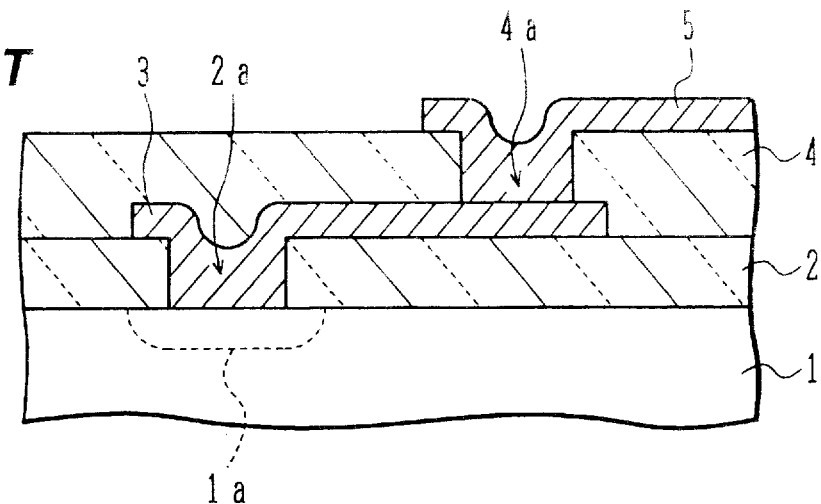
FIG. 23 is a cross sectional view of a substrate showing a conventional multi-layer wiring structure.
Figure 24:
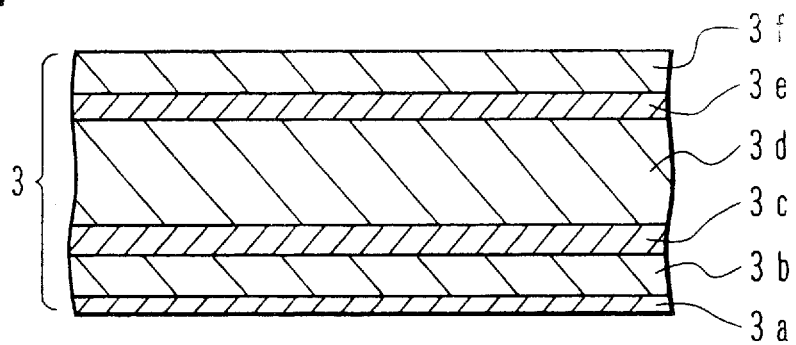
FIG. 24 is a cross sectional view showing an example of a lamination structure of a first-level wiring layer.
Figure 25:
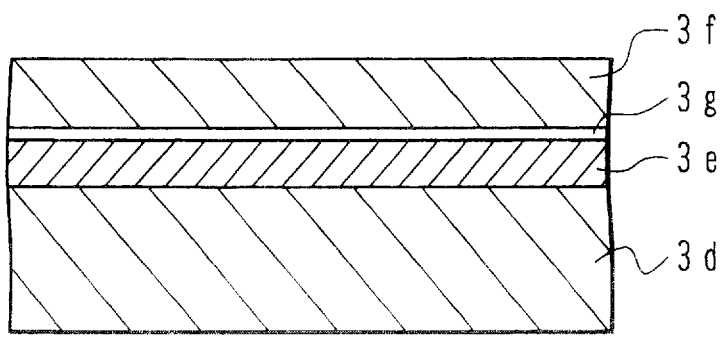
FIG. 25 is a cross sectional view illustrating a problem of the wiring layer shown in FIG. 24.
Figure 26:
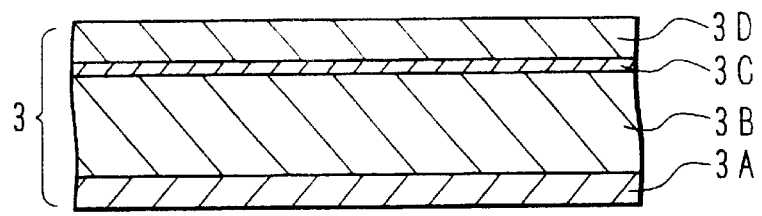
FIG. 26 is a cross sectional view showing another example of the first-level wiring layer.

FIGS. 21 and 22 are graphs showing a permeation state of W into the samples shown in FIGS. 17 and 18 by curves Wa and Wb. It can be understood from the comparison between FIGS. 21 and 22 that the TiON layer has a barrier capability relative to W more than the TiN layer.

Figure 1:
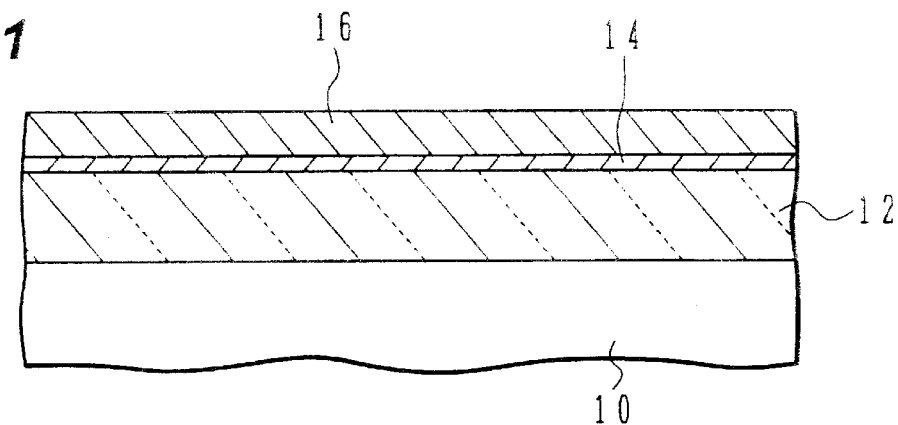
FIG. 1 is a cross sectional view of a substrate illustrating a step of forming an Al alloy layer in a method of forming a multi-layer wiring according to an embodiment of the invention.
Figure 2:
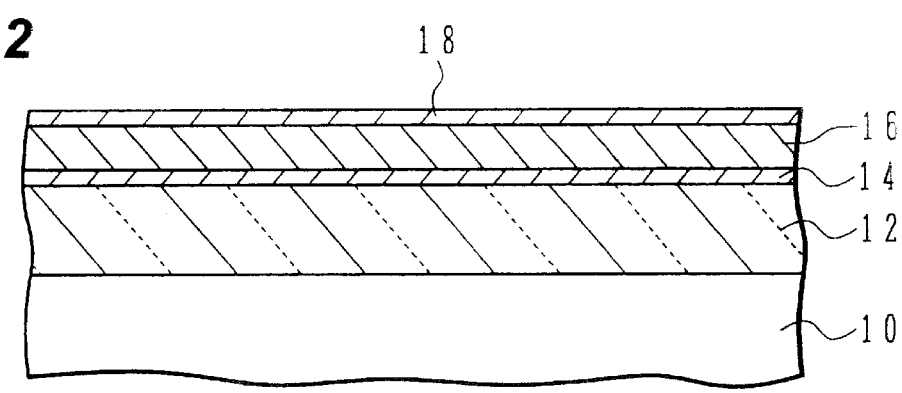
FIG. 2 is a cross sectional view of the substrate illustrating a step of forming an antireflection film after the process shown in FIG. 1.
Figure 3:
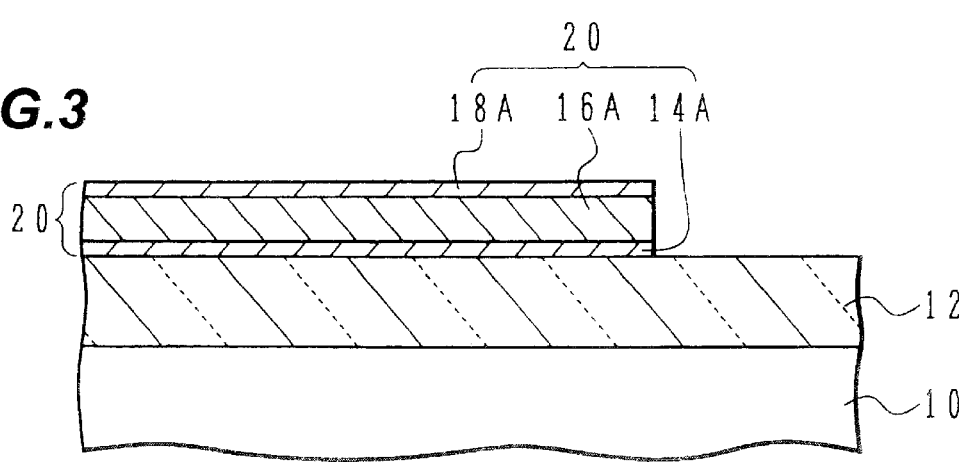
FIG. 3 is a cross sectional view of the substrate illustrating a step of patterning a wiring layer after the process shown in FIG. 2.
Figure 4:
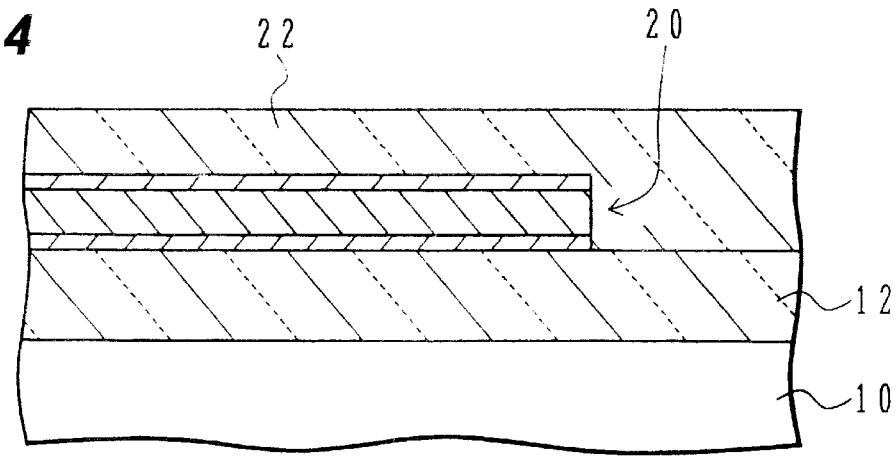
FIG. 4 is a cross sectional view of the substrate illustrating a step of forming an interlayer insulating film after the process shown in FIG. 3.
Figure 5:
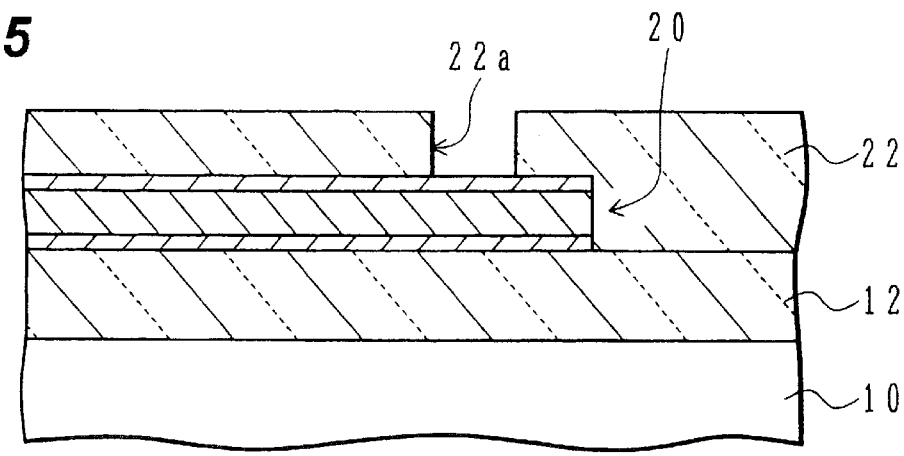
FIG. 5 is a cross sectional view of the substrate illustrating a step of forming a contact hole after the process shown in FIG. 4.
Figure 6:
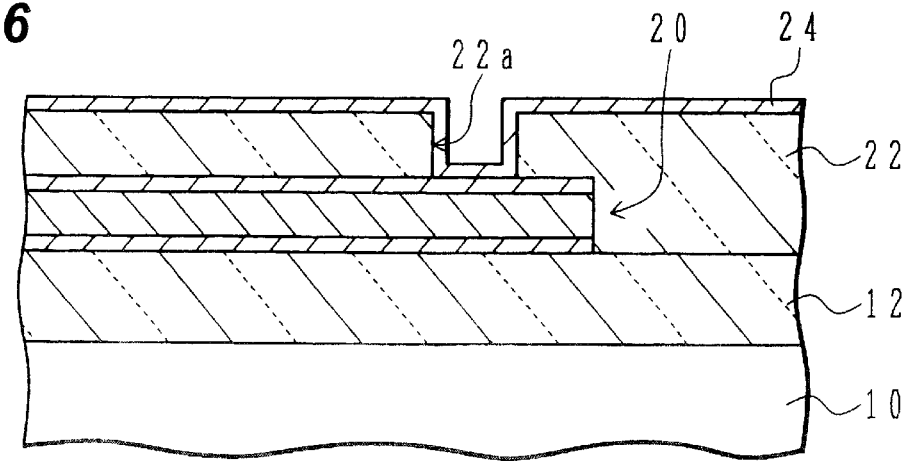
FIG. 6 is a cross sectional view of the substrate illustrating a step of forming a tight adhesion layer after the process shown in FIG. 5.

In the process shown in FIG. 6, the TiON layer 24c is formed as an intermediate layer of the tight adhesion layer 24. Therefore, since the TiON layer prevents permeation of $WF_6$ during the process of FIG. 7, it is possible to prevent formation of an $AlF_x$ layer in the wiring layer 20. If pin holes are not formed in the TiON layer, like the samples $Q_2$ to $Q_4$, during the dry etching process of forming a contact hole, also the TiON layer 18c in the antireflection layer 18 functions as a barrier layer relative to $WF_6$ and a synergetic countermeasure for $AlF_x$ is achieved. If pin holes are not formed in the TiN layer, like the sample $P_2$, during the dry etching process of forming a contact hole, it is possible to omit the TiON layer 18c in the antireflection layer 18. In this case, formation of the AlF$_x$ layer can be prevented by utilizing the barrier capability of the TiON layer 24c of the tight adhesion layer 24.

Figure 28A:
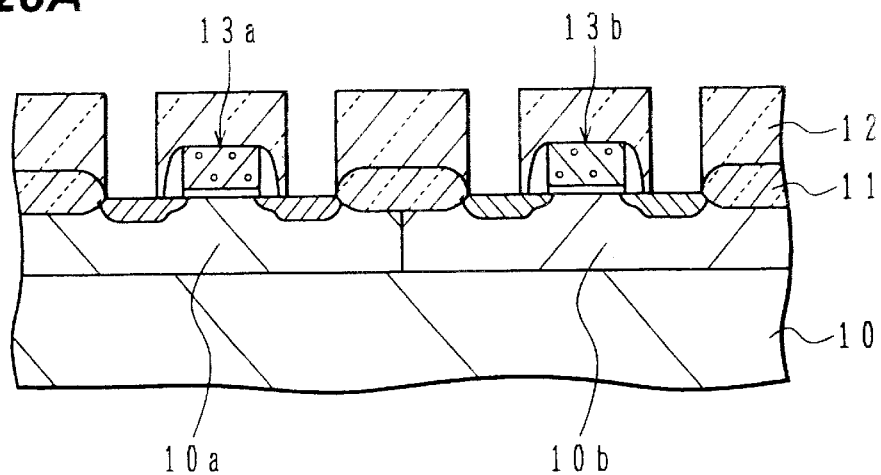
FIGS. 28A and 28B are cross sectional views showing an integrated circuit device according to an embodiment of the invention.
Figure 28B:
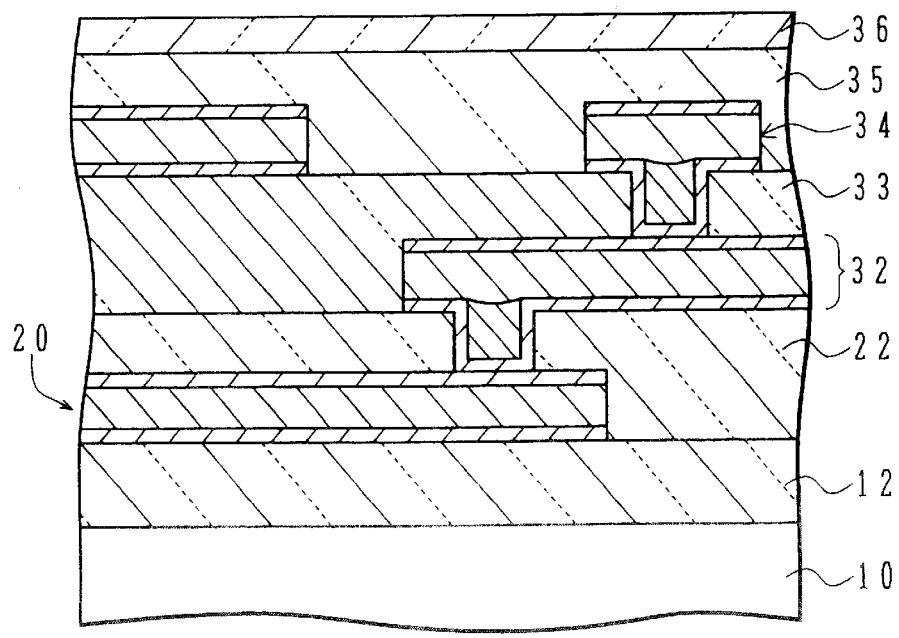

With reference to FIGS. 28A and 28B, a method of manufacturing an integrated circuit device will be described.

As shown in FIG. 28A, a p-type well 10a and an n-type well 10b are formed in the surface layer of a silicon substrate 10 of, for example, a p-type, and field oxide films 11 are formed to define active regions. On the surface of each active region defined by the field oxide films 11, a gate oxide film is formed through thermal oxidation. On this oxide film, a gate electrode layer made of polysilicon or polycide is formed. The gate electrode layer is patterned to form a gate electrode, and ions are implanted for lightly doped drain (LDD) regions. An insulating film such as an oxide film is deposited over the whole surface of the substrate. The insulating film on a flat surface is removed through anisotropic ion etching (RIE) to form side wall spacers on the gate electrode. With the above processes, gate electrode structures 13a, 13b are formed. Next, ions are implanted for source/drain high impurity concentration regions. Ion implantation is performed separately for n-channel and p-channel transistors. Thereafter, an interlayer insulating film 12 is deposited over the substrate and contact holes are formed through the interlayer insulating film 12.

On this semiconductor structure, necessary multi-layer wiring layers are formed. The number of wiring layers change with the type of each device.

FIG. 28(B) shows an example of a three-layer wiring structure. On a first interlayer insulating film 12, a first wiring layer 20 is formed and on this first wiring layer a second interlayer insulating film 22 is deposited. After a contact hole is formed through the second interlayer insulating film 22, a second wiring layer 32 is formed on the second interlayer insulating film 22. On this second wiring layer 32, a third interlayer insulating film 33 is deposited. After a contact hole is formed through the third interlayer insulating film 33, a third wiring layer 34 is formed on the third interlayer insulating film 33. An insulating layer 35 and a cap layer 36 are deposited covering the third wiring layer. Each wiring layer can be formed by the above-described embodiment method of forming a wiring layer.

The present invention has been described in connection with the preferred embodiments. The invention is not limited only to the above embodiments. It will be apparent to those skilled in the art, that various modifications, improvements, combinations, and the like can be made. For example, an Al layer may be used in place of the Al alloy layer 18 or 28. The W plug may be formed by selectively growing W in the contact hole.

What is claimed is:

1. A multi-layer forming method comprising the steps of:
   forming an Al or Al alloy layer on a first insulating film covering a substrate;
   forming a first Ti layer on the Al or Al alloy layer;
   sequentially laminating a first TiN layer and a first TiON layer in this order on the first Ti layer through reactive sputtering;
   patterning a lamination of the Al or Al alloy layer, the first Ti layer, the first TiN layer, and the first TiON layer into a desired wiring pattern to form a first wiring layer;
   forming a second insulating film on the first insulating film, the second insulating film covering the first wiring layer;
   forming a contact hole through the second insulating film, the contact hole reaching a partial surface area of the first TiON layer;
   forming a tight adhesion layer covering an inner surface of the contact hole;
   forming a conductive plug embedding an inside of the contact hole, with the tight adhesion layer being interposed under the conductive plug; and
   forming a second wiring layer on the second insulating film, the second wiring layer being connected to the plug.

2. A multi-layer wiring forming method according to claim 1, wherein the tight adhesion layer is a lamination of a second Ti layer, a second TiN layer, a second TiON layer, and a third TiN layer sequentially stacked in this order from a bottom side, and wherein after the second Ti layer is formed, the second TiN layer, the second TiON layer, and the third TiN layer are sequentially formed through reactive sputtering.

3. A multi-layer wiring forming method according to claim 1, further comprising the steps of:
   forming a third insulating film on the second insulating film, the third insulating film covering the second wiring layer and having a contact hole reaching a partial surface area of the second wiring layer;
   forming a tight adhesion layer covering an inner surface of the contact hole;
   forming a conductive plug embedding an inside of the contact hole, with the tight adhesion layer being interposed under the conductive plug; and
   forming a third wiring layer on the third insulating film, the third wiring layer being connected to the plug.

4. A multi-layer wiring forming method according to claim 3, wherein the tight adhesion layer is a lamination of a third Ti layer, a third TiN layer, a third TiON layer, and a fourth TiN layer sequentially stacked in this order from a bottom side, and wherein after the third Ti layer is formed, the second TiN layer, the third TiON layer, and the fourth TiN layer are sequentially formed through reactive sputtering.

5. A multi-layer forming method comprising the steps of:
   forming a first wiring layer on a first insulating film covering a substrate;
   forming a second insulating film on the first insulating film, the second insulating film covering the first wiring layer;
   forming a contact hole through the second insulating film, the contact hole reaching a partial surface area of the first wiring layer;
   forming a tight adhesion layer covering an inner surface of the contact hole, the tight adhesion layer being a lamination of a Ti layer, a first TiN layer, a TiON layer, and a second TiN layer sequentially stacked in this order from a bottom side, wherein after the Ti layer is formed, the first TiN layer, the first TiON layer, and the second TiN layer are sequentially formed through reactive sputtering;
   forming a conductive plug embedding an inside of the contact hole, with the tight adhesion layer being interposed under the conductive plug; and
   forming a second wiring layer on the second insulating film, the second wiring layer being connected to the plug.

* * * * *